United States Patent [19]
Ao et al.

[11] Patent Number: 6,052,031
[45] Date of Patent: Apr. 18, 2000

[54] SIGNAL LEVEL CONTROL CIRCUIT FOR AMPLIFIERS

[75] Inventors: Jiening Ao, Duluth; Pieter Ibelings, Norcross, both of Ga.

[73] Assignee: Scientific-Atlanta, Inc., Norcross, Ga.

[21] Appl. No.: 09/140,261

[22] Filed: Aug. 26, 1998

[51] Int. Cl.[7] .................................................. H03G 3/20
[52] U.S. Cl. ........................................ 330/289; 330/284
[58] Field of Search ............................... 330/2, 129, 284, 330/289; 348/707

[56] References Cited

U.S. PATENT DOCUMENTS

| | | | |
|---|---|---|---|
| 5,109,286 | 4/1992 | West et al. | 348/55 |
| 5,177,453 | 1/1993 | Russell et al. | 330/289 X |
| 5,381,115 | 1/1995 | Timmons et al. | 330/284 X |
| 5,488,413 | 1/1996 | Elder et al. | 348/13 |

*Primary Examiner*—Steven J. Mottola
*Attorney, Agent, or Firm*—Kenneth M. Massaroni; Kelly A. Gardner; Hubert J. Barnhardt, III

[57] ABSTRACT

An amplifier (125) includes a gain stage (210) for amplifying a signal, a variable attenuator (208), such as a Bode circuit, coupled to the gain stage (210) for attenuating the signal, and a signal level control circuit (222, 218, 220) coupled to the variable attenuator (208) and the gain stage (210) The signal level control circuit includes a thermal circuit (218) for measuring a temperature and a removable automatic gain control (AGC) circuit (220) for measuring signal level output by the gain stage (210). An adapter (222) coupled to the thermal circuit (218) and the removable AGC circuit (220) for controlling attenuation of the variable attenuator (208) in response to the temperature when the removable AGC circuit (220) is not electrically coupled to the gain stage (210) and in response to the signal level when the removable AGC circuit (220) is electrically coupled to the gain stage (210).

20 Claims, 7 Drawing Sheets

SIGNAL LEVEL CONTROL CIRCUIT FOR AMPLIFIERS

FIELD OF THE INVENTION

This invention relates generally to amplifiers, and more specifically to signal level control circuitry for amplifiers.

BACKGROUND OF THE INVENTION

Communication systems, such as two-way cable television systems, typically process signals in both the forward, or downstream, direction and the reverse, or upstream, direction. These signals may travel long distances and, as a result, distribution amplifiers are typically employed to amplify the signal levels of the forward and reverse signals.

Thermal circuits are often employed to detect the temperature within the amplifier. As the temperature within the amplifier rises, a variable attenuator, such as a Bode circuit, is adjusted to boost the gain of the amplifier. This compensates for the decrease in gain that is a normal consequence of higher temperatures. Thermal circuits, however, are relatively imprecise and may not be able to compensate for other causes of gain variation. As a result, some amplifiers alternatively use automatic gain control (AGC) circuits. Although AGC circuits provide better performance, they typically use a larger number of components, require more space within an amplifier, and cost more than conventional thermal circuits.

Thus, what is needed is a more flexible way to provide signal level control in an amplifier for a communication system.

DETAILED DESCRIPTION OF A PREFERRED EMBODIMENT

Figure 1:
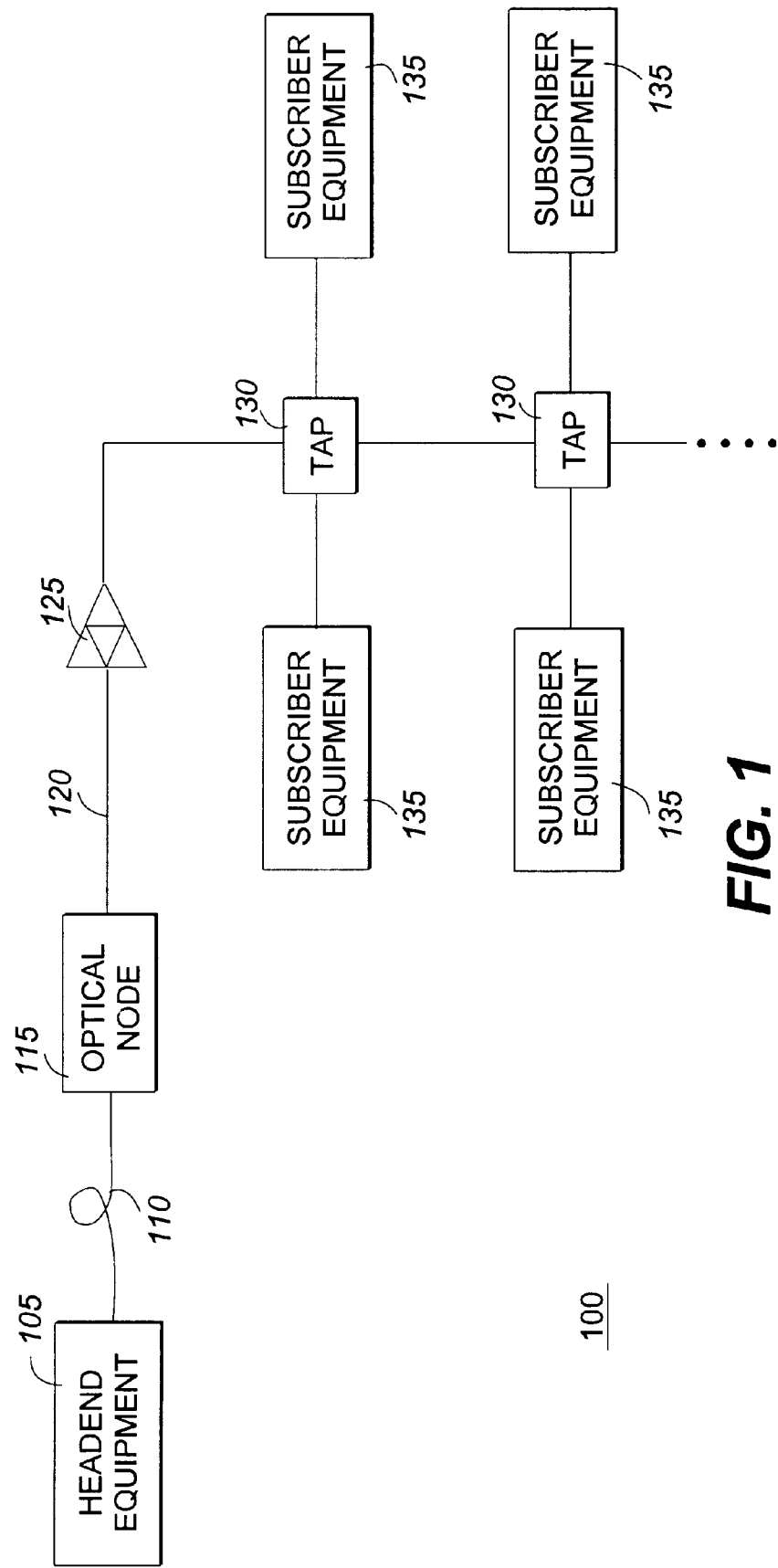
FIG. 1 is a block diagram of a communication system, such as a cable television system, according to the present invention.

A communication system 100, such as a two-way cable television system, is depicted in FIG. 1, which shows headend equipment 105 for generating forward signals that are transmitted in the downstream direction along a communication medium, such as fiber optic cable 110, to an optical node 115 that converts optical signals to radio frequency (RF) signals. The RF signals are further transmitted along another communication medium, such as coaxial cable 120, and are amplified, as necessary, by one or more distribution amplifiers 125 positioned along the communication medium. Taps 130 included in the cable television system 100 split off portions of the forward signals for provision to subscriber equipment 135, such as set top terminals, computers, and televisions. In a two-way system, the subscriber equipment 135 can also generate reverse signals that are transmitted upstream, amplified by any distribution amplifiers 125, converted to optical signals, and provided to the headend equipment 105.

Figure 2:
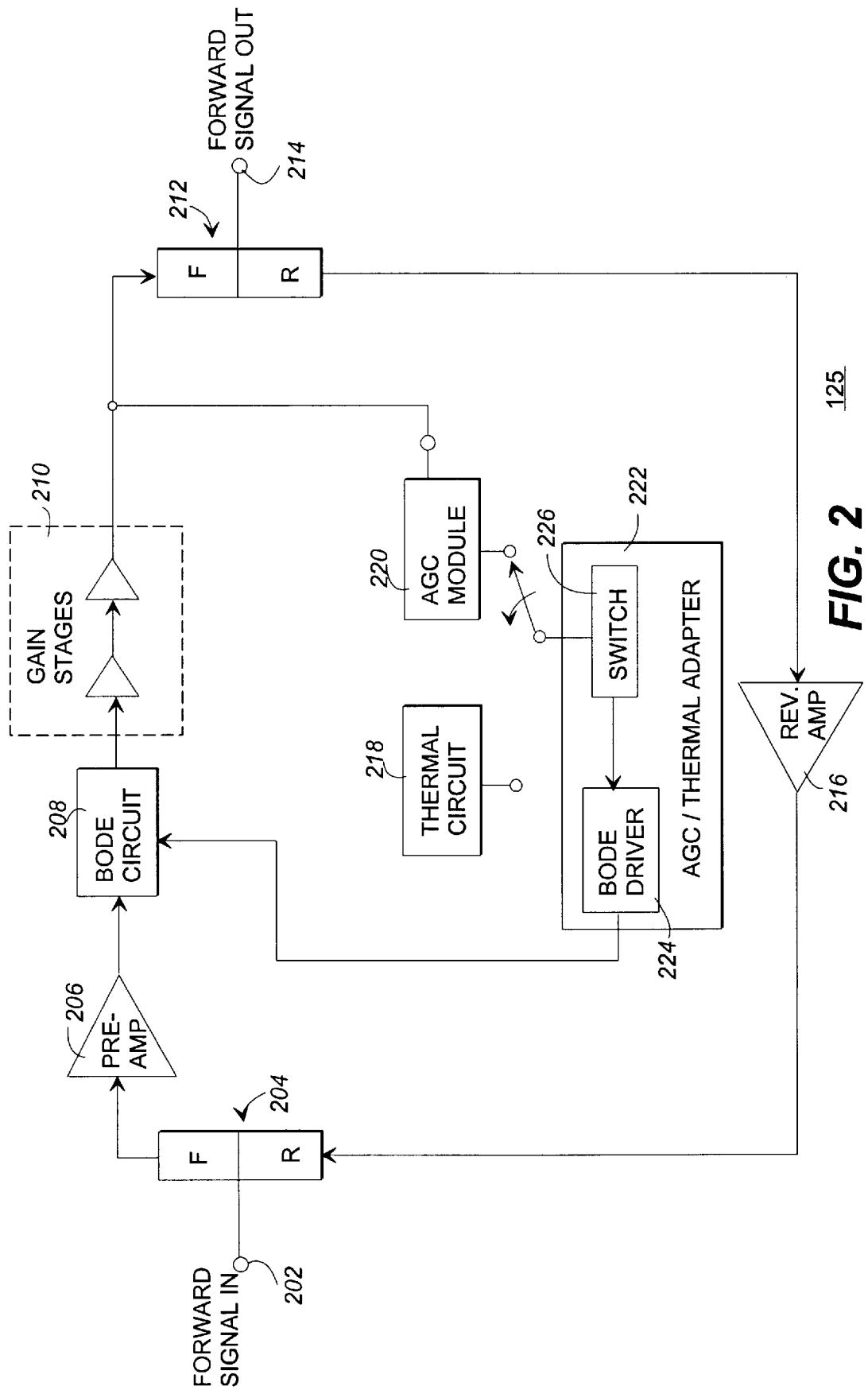
FIG. 2 is an electrical block diagram of an amplifier included in the communication system of FIG. 1 according to the present invention.

Referring next to FIG. 2, an electrical block diagram of an amplifier 125 is depicted. The amplifier 125 receives a forward electrical signal from the headend equipment 105 at a first port, i.e., the input port 202. The forward signal is transmitted by the forward section of a diplex filter 204 to a preamplifier 206 and then to one or more gain stages 210 for amplifying the forward signal. An output of the gain stages 210 is provided to the forward section of another diplex filter 212 and then to a second port, i.e., the output port 214, of the amplifier 125. The amplifier 125 can, in a two-way system 100, also include a reverse electrical path comprising a reverse gain stage 216 for amplifying reverse electrical signals. A reverse electrical signal is received at the second port 214 and forwarded by the reverse section of the diplex filter 212 to the input of the reverse gain stage 216. The amplified reverse signal is then provided to the first port 202 via the reverse section of the diplex filter 204.

Returning to the forward electrical path, the output of the gain stages 210 is also coupled to a signal level control circuit according to the present invention. The signal level control circuit includes a variable attenuator 208, such as a Bode circuit, coupled to the input of the gain stages 210 for attenuating the forward signal prior to its amplification. The signal level control circuit further includes means for controlling the attenuation of the Bode circuit 208 in response to the signal level of the amplified forward signal.

The signal level control circuit controls signal attenuation through use of either a thermal circuit 218 or an automatic gain control (AGC) module 220, in combination with an AGC/thermal adapter 222 that includes a switch 226 and a driver 224, such as a Bode driver. Preferably, the amplifier 125 includes the thermal circuit 218 and the adapter 222 as fixed components, such as components reflowed on a printed circuit board(s) within the amplifier 125, while the AGC module 220 is preferably a removable, plug-in module that can be easily installed and removed from the amplifier 125 after manufacture, such as after the amplifier 125 has been deployed in the field.

According to the present invention, the adapter 222 senses the presence or absence of the AGC module 220 within the amplifier 125. This can be done, for instance, by measuring voltage on a port that electrically couples to the AGC module 220 when it is inserted into the amplifier 125. When the voltage is low, the adapter 222 determines that the AGC module 220 is not electrically coupled within the amplifier 125. When, on the other hand, the voltage is high, the adapter 222 determines that the AGC module 220 is electrically coupled within the amplifier 125. When the AGC module 220 is not present, the switch 226 of the adapter 222 couples the thermal circuit 218 to the Bode driver 224, and, when the AGC module 220 is present, the switch 226 couples the AGC module 220 to the Bode driver 224.

The thermal circuit 218 of the present invention can be implemented using conventional circuitry. For example, a thermistor can be included within the thermal circuit 218 to sense temperature, and, in response to increased temperature, the Bode driver 224 could be operated to decrease the attenuation provided by the Bode circuit 208. When the AGC module 220 is present, the thermal circuit 218 is disabled, i.e., electrically decoupled from other amplifier circuits, and the AGC module 220 is enabled. The AGC module then operates in a well known manner to adjust the signal level that is provided by the gain stages 210.

Figure 3A:
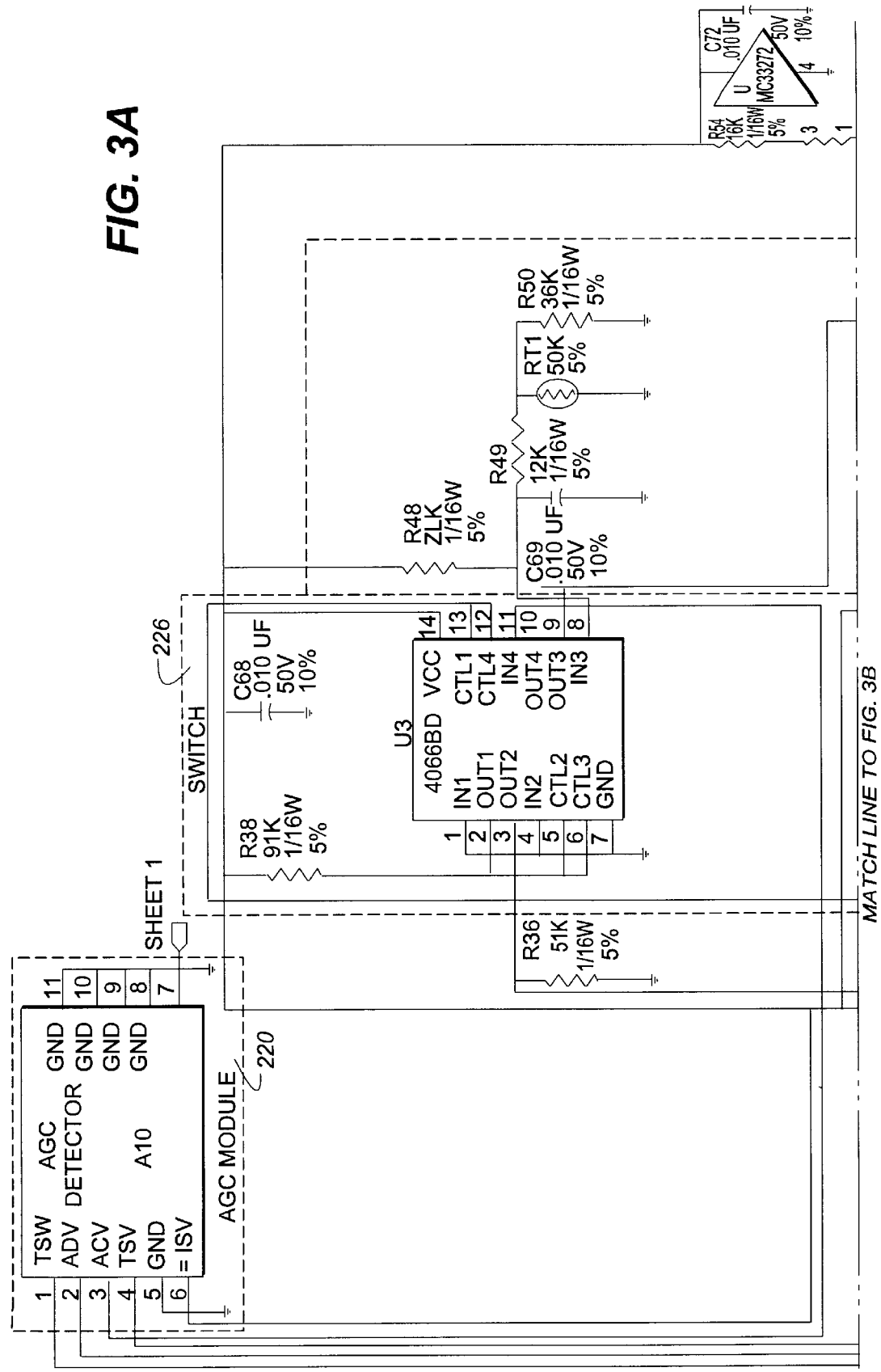
FIG. 3 is an electrical circuit diagram of switching circuitry for an adaptive thermal-to-AGC mode control circuit used in the amplifier of FIG. 2 according to the present invention.
Figure 3B:
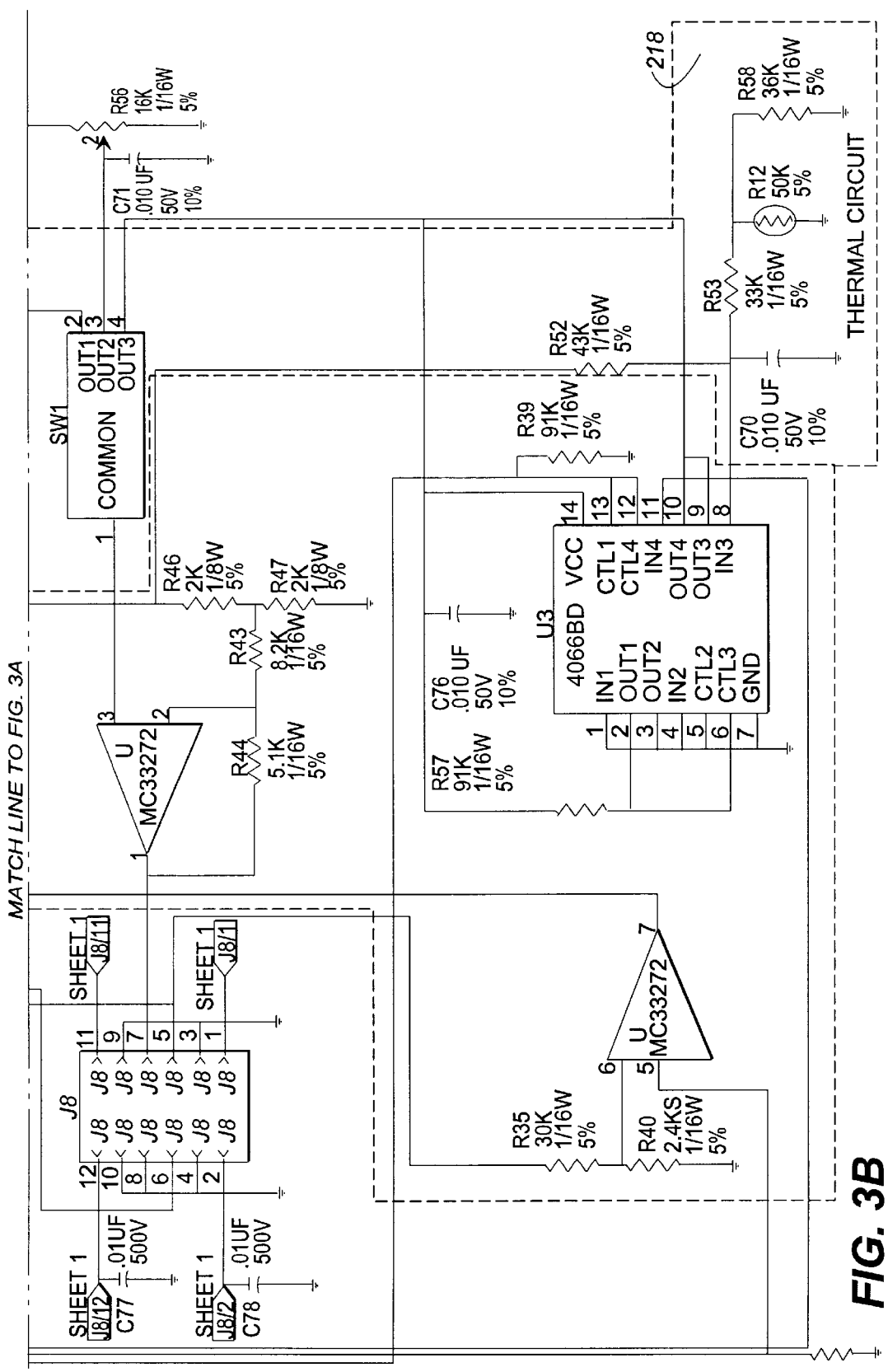
Figure 4:
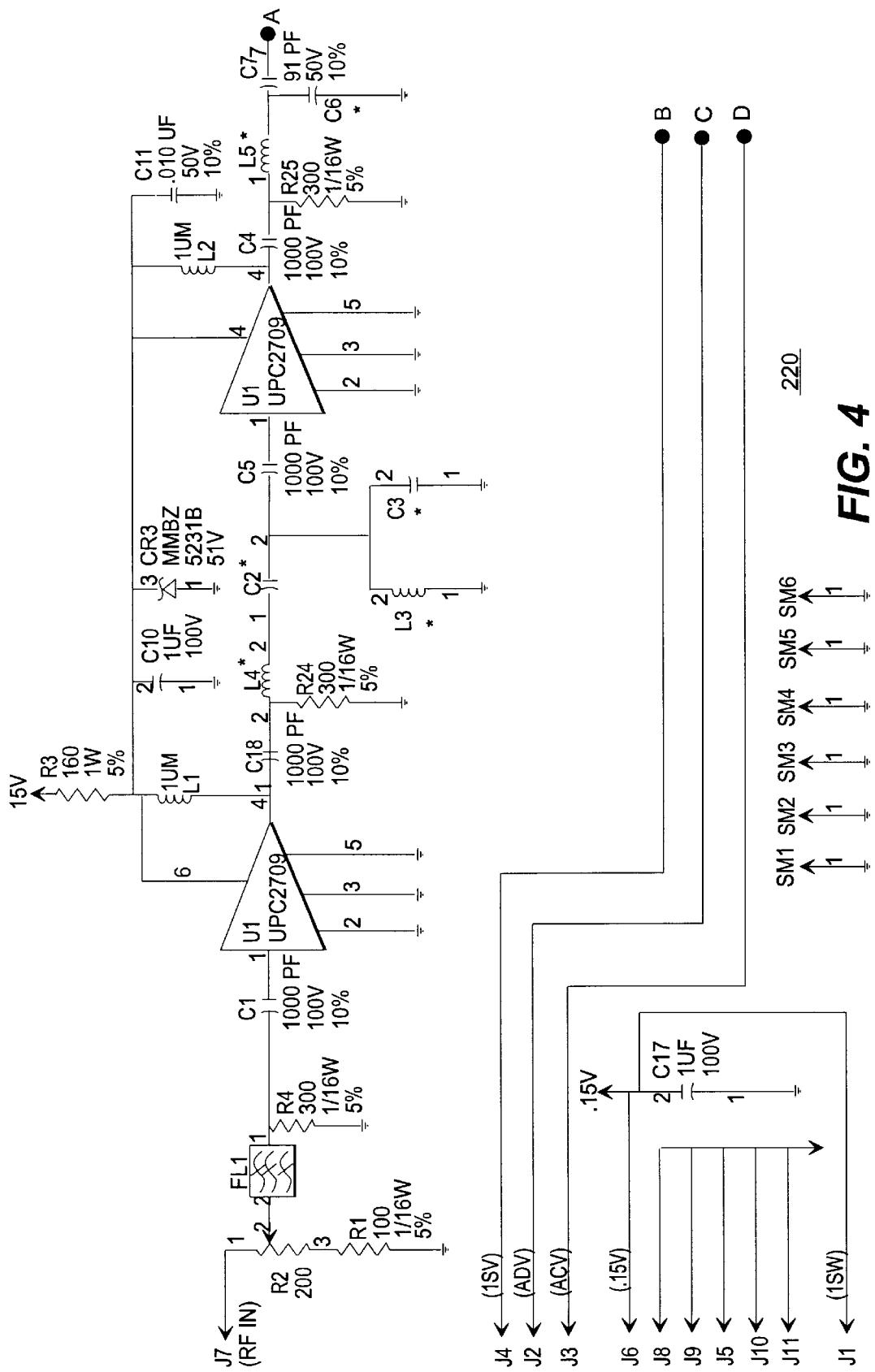
FIGS. 4 and 5 show an electrical circuit diagram of a removable AGC module that can be included within the amplifier of FIG. 2 according to the present invention.
Figure 5:
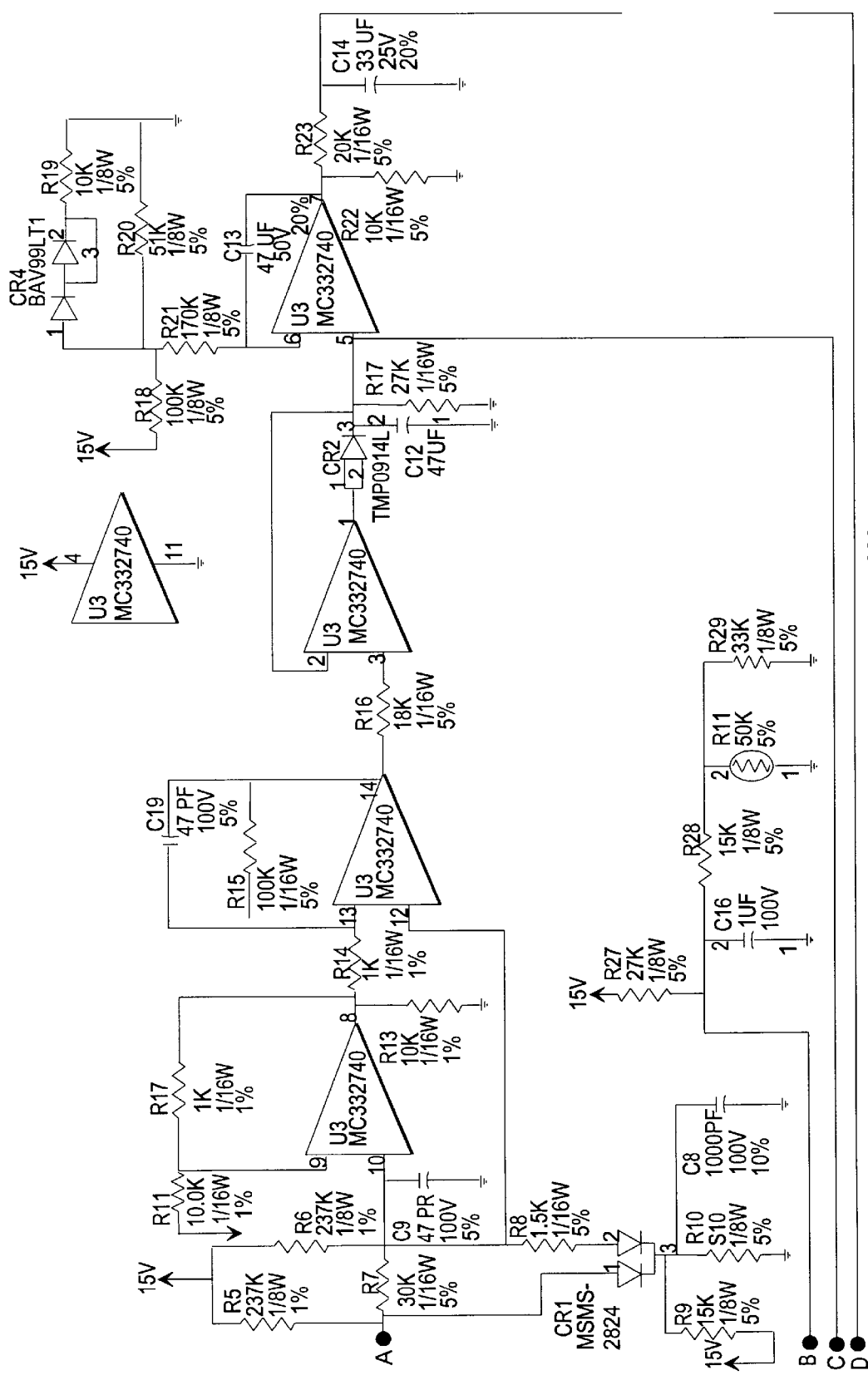
Figure 6:
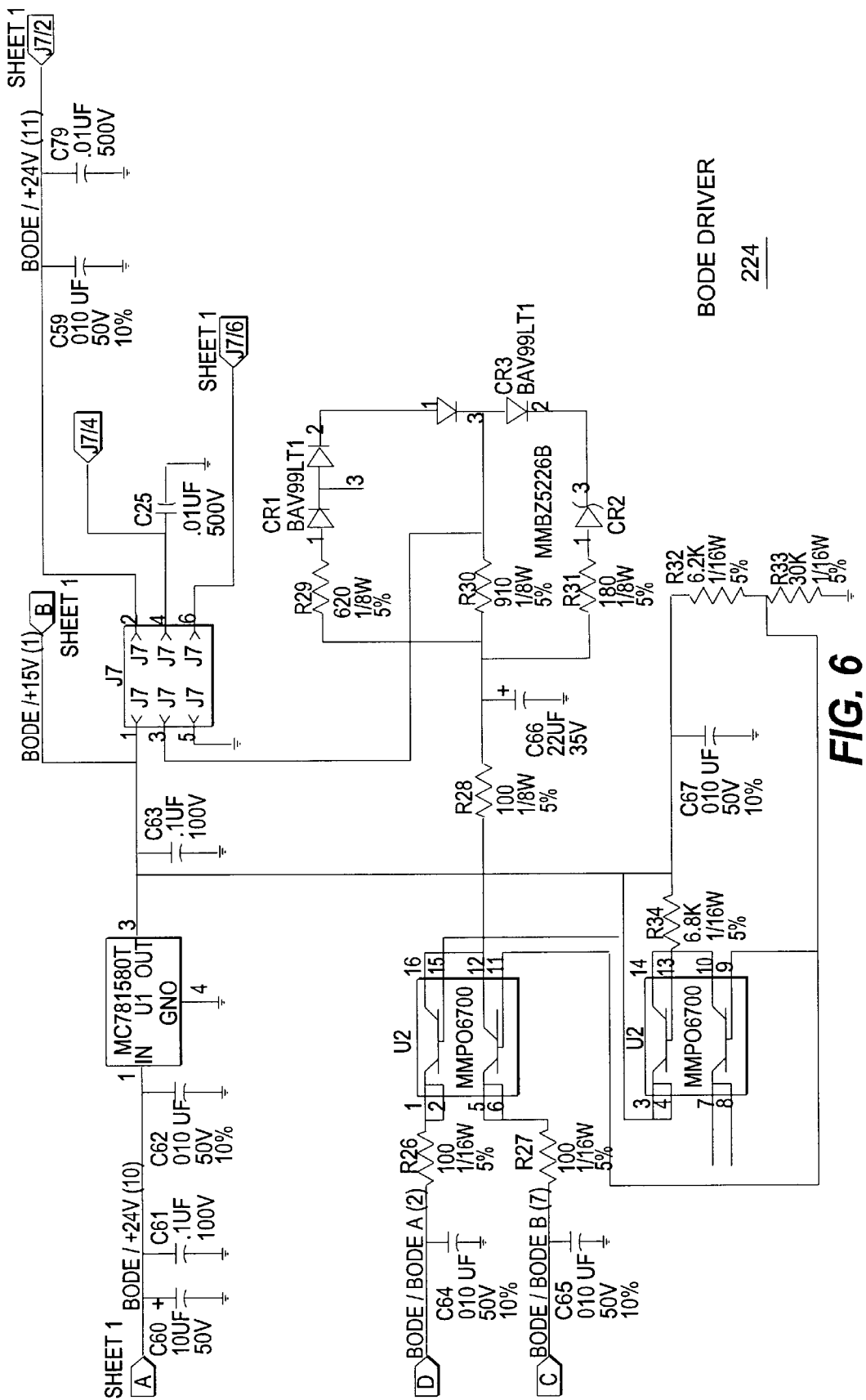
FIG. 6 is an electrical circuit diagram of a bode driver for the adaptive thermal-to-AGC mode control circuit in the amplifier of FIG. 2 according to the present invention.

The thermal circuit 218 and the switch 226 can, for instance, be implemented using the circuits of FIG. 3, which also depicts a representative AGC module 220 and its respective electrical terminals. Circuitry that can be used to implement the AGC module 220 is shown in FIGS. 4 and 5, and FIG. 6 illustrates an example of circuitry that can be employed to implement the Bode driver 224. It will be appreciated that different circuits, and even software, could be alternatively used to provide equivalent functions.

An advantage of the present invention is that a thermal circuit 218 can be provided as a standard amplifier feature at relatively low cost. For applications in which more precise performance is required, a system operator can then conveniently plug-in an AGC module 220 that will automatically begin functioning within the amplifier 125 to provide different signal level control operations. As a result, the manufacturer of the amplifier 125 need not manufacture two different devices, one with the thermal circuit and one with the AGC module. Furthermore, the purchaser of the amplifier 125 can determine, by use in the field, whether the less expensive thermal circuit sufficiently satisfies specifications before having to purchase a more expensive AGC module.

As mentioned above, the thermal circuit is preferably included within the amplifier 125 at manufacture. However, other amplifier embodiments are envisioned in which the thermal circuit is also manufactured as a removable plug-in module. Although such a thermal circuit module and the described AGC module would require slightly different electrical connections, the amplifier 125 could be designed so that the interchangeable thermal and AGC modules occupy a similar amount of space in a similar location, thereby reducing the overall size of the resulting amplifier.

In summary, the amplifier described above includes a signal level control circuit that uses alternative methods for controlling attenuation of the signal provided to gain stages of the amplifier. More specifically, the variable attenuator, e.g., the Bode circuit, coupled to the input of the gain stages is normally controlled responsive to a temperature measured by a thermal circuit included within the amplifier. However, a removable, plug-in AGC module can be plugged into receptacles within the amplifier to electrically couple an AGC circuit to the output of the gain stages. When this occurs, circuitry within the amplifier detects the presence of the AGC circuit and switches over to the AGC circuit. In other words, when the AGC circuit is present, the thermal circuit is disconnected, and the AGC circuit is connected so that the variable attenuator is controlled responsive to outputs from the AGC circuit, rather than outputs of the thermal circuit. As a result, alternative signal level control circuits can conveniently operate within the same amplifier, permitting a greater degree of flexibility than is currently the case for prior art amplifiers.

What is claimed is:

1. An amplifier, comprising:
a gain stage for amplifying a signal;
a variable attenuator coupled to the gain stage for attenuating the signal; and
a signal level control circuit coupled to the variable attenuator and the gain stage, the signal level control circuit comprising:
a thermal circuit for measuring a temperature;
a removable automatic gain control (AGC) circuit for measuring signal level output by the gain stage; and
an adapter coupled to the thermal circuit and the removable AGC circuit for controlling attenuation of the variable attenuator in response to the temperature when the removable AGC circuit is not electrically coupled to the gain stage and in response to the signal level when the removable AGC circuit is electrically coupled to the gain stage.

2. The amplifier of claim 1, wherein the variable attenuator comprises a bode circuit having an output to which an input of the gain stage is coupled.

3. The amplifier of claim 1, wherein an input of the gain stage is coupled to an output of the variable attenuator.

4. The amplifier of claim 3, wherein an output of the gain stage is coupled to an input of the removable AGC circuit, when the AGC circuit is present in the amplifier.

5. The amplifier of claim 4, wherein the adapter comprises:
a switch circuit for disabling the thermal circuit when the AGC circuit is present in the amplifier and for enabling the thermal circuit when the AGC circuit is not present in the amplifier.

6. The amplifier of claim 5, further comprising:
a driver circuit coupled to the switch circuit for driving the variable attenuator.

7. The amplifier of claim 5, wherein the thermal circuit comprises:
a thermistor characterized by a resistance that varies over temperature.

8. The amplifier of claim 5, further comprising:
an input port for receiving a forward signal;
an output port for providing an amplified forward signal; and
a forward electrical path coupled between the input and output ports in which the gain stage, the variable attenuator, and the signal level control circuit are located for processing the forward signal to generate therefrom the amplified forward signal.

9. The amplifier of claim 8, wherein the output port receives a reverse signal, wherein the input port provides an amplified reverse signal, and wherein the amplifier further comprises:
a reverse electrical path coupled between the input and output ports; and
a reverse gain stage located in the reverse electrical path for processing the reverse signal to generate the amplified reverse signal.

10. A communication system, comprising:
a transmission system for providing an electrical signal;
a receiver for receiving and processing the electrical signal; and
an amplifier coupled between the transmission system and the receiver for amplifying the electrical signal prior to its reception by the receiver, the amplifier comprising a gain stage for amplifying the electrical signal, a variable attenuator coupled to the gain stage for attenuating the electrical signal to control an output of the gain stage, and a signal level control circuit coupled to the variable attenuator and the gain stage, the signal level control circuit including:
a thermal circuit for measuring a temperature;
a removable automatic gain control (AGC) circuit for measuring signal level output by the gain stage; and
an adapter coupled to the thermal circuit and the removable AGC circuit for controlling attenuation of the variable attenuator in response to the temperature when the removable AGC circuit is not electrically coupled to the gain stage and in response to the signal level when the removable AGC circuit is electrically coupled to the gain stage.

11. The communication system of claim 10, wherein the variable attenuator comprises a bode circuit having an output to which an input of the gain stage is coupled.

12. The communication system of claim 10, wherein an input of the gain stage is coupled to an output of the variable attenuator.

13. The communication system of claim 12, wherein an output of the gain stage is coupled to an input of the removable AGC circuit, when the AGC circuit is present in the amplifier.

14. The communication system of claim 13, wherein the adapter comprises:

a switch circuit for disabling the thermal circuit when the AGC circuit is present in the amplifier and for enabling the thermal circuit when the AGC circuit is not present in the amplifier.

15. The communication system of claim 14, wherein the amplifier further comprises:

a driver circuit coupled to the switch circuit for driving the variable attenuator.

16. The communication system of claim 14, wherein the thermal circuit of the amplifier comprises:

a thermistor characterized by a resistance that varies over temperature.

17. The communication system of claim 14, wherein the amplifier further comprises:

an input port for receiving the electrical signal;

an output port for providing an amplified electrical signal; and a forward electrical path coupled between the input and output ports in which the gain stage, the variable attenuator, and the signal level control circuit are located for processing the electrical signal to generate therefrom the amplified electrical signal.

18. The communication system of claim 17, wherein the output port of the amplifier receives a reverse signal, wherein the input port of the amplifier provides an amplified reverse signal, and wherein the amplifier further comprises:

a reverse electrical path coupled between the input and output ports; and a reverse gain stage located in the reverse electrical path for processing the reverse signal to generate the amplified reverse signal.

19. The communication system of claim 18, wherein the communication system comprises a cable television system.

20. The communication system of claim 19, wherein the transmission system comprises headend equipment and the receiver comprises subscriber equipment that generates the reverse signal.

\* \* \* \* \*